United States Patent
Govindaraj et al.

(10) Patent No.: US 9,543,013 B1
(45) Date of Patent: Jan. 10, 2017

(54) MAGNETIC TUNNEL JUNCTION TERNARY CONTENT ADDRESSABLE MEMORY

(71) Applicants: Rekha Govindaraj, Tampa, FL (US); Swaroop Ghosh, Tampa, FL (US)

(72) Inventors: Rekha Govindaraj, Tampa, FL (US); Swaroop Ghosh, Tampa, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 15/174,498

(22) Filed: Jun. 6, 2016

Related U.S. Application Data

(60) Provisional application No. 62/171,476, filed on Jun. 5, 2015.

(51) Int. Cl.
  *G11C 15/02* (2006.01)
  *G11C 11/16* (2006.01)

(52) U.S. Cl.
  CPC ............. *G11C 15/02* (2013.01); *G11C 11/161* (2013.01)

(58) Field of Classification Search
  CPC ...................................................... G11C 15/02
  USPC .................................................. 365/49.1–50
  See application file for complete search history.

(56) References Cited

U.S. PATENT DOCUMENTS

| | | | | |
|---|---|---|---|---|
| 8,023,299 | B1 | 9/2011 | Gharia | |
| 8,228,702 | B2 * | 7/2012 | Javerliac | G11C 11/16 365/158 |
| 8,228,703 | B2 * | 7/2012 | Javerliac | G11C 15/046 365/49.17 |
| 8,576,601 | B2 | 11/2013 | Marukame et al. | |
| 8,885,379 | B2 * | 11/2014 | Alvarez-Herault | G11C 15/046 365/49.11 |
| 2010/0110744 | A1 * | 5/2010 | El Baraji | G11C 15/046 365/50 |
| 2011/0002151 | A1 * | 1/2011 | Javerliac | G11C 11/16 365/50 |
| 2012/0290773 | A1 * | 11/2012 | Naccache | G06F 8/66 711/103 |
| 2013/0208523 | A1 * | 8/2013 | Alvarez-Herault | G11C 11/16 365/50 |

FOREIGN PATENT DOCUMENTS

| | | |
|---|---|---|
| EP | 2204814 B1 | 10/2011 |
| EP | 2626861 A1 | 8/2013 |

OTHER PUBLICATIONS

Pagiamtzis and Sheikholeslami. Content-addressable memory (CAM) circuits and architectures: A tutorial and survey. IEEE Journal of Solid-State Circuits. 2006. vol. 41 (No. 3): 712-727.
Shen et al., Effect of film roughness in MgO-based magnetic tunnel junctions. Applied physics letters. 2006. vol. 88: 182508-182508.

(Continued)

*Primary Examiner* — Harry W Byrne
(74) *Attorney, Agent, or Firm* — Molly L. Sauter; Michele L. Lawson; Smith & Hopen, P.A.

(57) ABSTRACT

A Magnetic Tunnel Junction (MJT) Ternary Content Addressable Memory (TCAM) employing six transistors and exhibiting reduced standby leakage and improved area-efficiency. In the proposed TCAM, data can be written to the MJT devices by conventional current induced magnetization techniques and by controlling the source line, thereby eliminating the need for external writing circuitry.

20 Claims, 19 Drawing Sheets

(56) References Cited

OTHER PUBLICATIONS

Xu et al., Spin-transfer torque magnetoresistive content addressable memory (CAM) cell structure design with enhanced search noise margin. IEEE International Symposium on Circuits and Systems (ISCAS 2008). 2008: 1898-1901.

Niebashi et al., A content addressable memory using magnetic domain wall motion cells. 2011 Symposium on VLSI Circuits Digent of Technical Papers (VLSIC). 2011: 300-301.

Zhang et al., Ultra-High Density Content Addressable Memory Based on Current Induced Domain Wall Motion in Magnetic Track. IEEE Transactions on Magnetics. 2012. vol. 48 (No. 1): 3219-3222.

Chen et al., Design and Evaluation of two MTJ-Based Content Addressable Non-Volatile Memory Cells. Proceedings of the 13th IEEE International Conference on Nanotechnology. Beijing, China. Aug. 5-8, 2013: 1-6.

Matsunaga et al., Stanby-Power-Free Compact Ternary Content-Addressable Memory Cell Chip Using Magnetic Tunnel Junction Devices. Applied Physics Express. 2009. vol. 2: 023004-1-023004-3.

Chun et al., A scaling roadmap and performance evaluation of in-plane and perpendicular MTJ based STT-MRAMs for high-density cache memory. IEEE Journal of Solid-State Circuits. 2013. vol. 48 (No. 2): 598-610.

Matsunaga et al., A 3.14 um2 4T-2MTJ-cell fully parallel TCAM based on nonvolatile logic-in-memory architecture. 2012 Symposium on VLSI Circuits (VLSIC), 2012: 44-45.

\* cited by examiner

"1" State   "0" State

Write "1"   Write "0"

MAGNETIC TUNNEL JUNCTION TERNARY CONTENT ADDRESSABLE MEMORY

CROSS-REFERENCE TO RELATED APPLICATIONS

This application claims priority to currently U.S. Provisional Application No. 62/171,476, entitled "A 6T-2 MTJ Ternary Content Addressable Memory", filed Jun. 5, 2015 by the same inventors, the entirety of which is incorporated herein by reference.

BACKGROUND OF THE INVENTION

Field of the Invention

This invention relates to content addressable memories. More specifically, the invention provides a magnetic tunnel junction (MTJ) based ternary content addressable memory (TCAM).

Brief Description of the Prior Art

Magnetic Tunnel Junction (MTJ) is a spintronic device which stores data in the form of spin of an electron, unlike a static Complementary Metal-Oxide-Semiconductor (CMOS) memory cell, which stores data in the form of electric potential. An MJT device consists of three layers—a layer of magnetic oxide sandwiched between two layers of magnetic material. Data is stored in the form of magnetization in the two magnetic material layers. A logic '0' is stored when the two magnetic layers are magnetized in the same direction and a logic '1' is stored when the two magnetic layers are magnetized in the opposite direction. FIG. 1A illustrates an MTJ device configuration in parallel and antiparallel states.

Pinned Layer (PL) magnetization exhibits a fixed magnetization, whereas Free Layer (FL) magnetization can be polarized parallel or anti-parallel with respect to the PL. In this context, it should be noted that the resistance of MTJ is high when PL and FL are in antiparallel configuration, whereas the resistance of MJT is low when PL an FL are parallel to each other. The value written to the MTJ depends on the direction and the strength of the charge current. The minimum current required to flip the state of the MTJ is called the critical current. FIG. 1B illustrates the directions charge current to write '1' and '0' to an MTJ device.

Tunnel Magneto Resistance (TMR) is the ratio of electrical resistances of the MTJ structure in parallel and antiparallel polarization states of FL relative to PL magnetization. If $R_H$ is the MTJ resistance in an antiparallel state and $R_L$ is the MTJ resistance in a parallel state, the TMR is defined as $$TMR = \frac{R_H - R_L}{R_L}$$

Content Addressable Memory (CAM) is widely used in pattern matching, internet data processing, packet forwarding, for tag bits storage in a processor cache, for associative memory and in many other fields where searching a specific pattern of data is a major operation. The special functionality of the content search in CAM requires a comparison circuitry integrated with the memory cell. The required comparator, in addition to the memory element itself, adds area and power overhead in CAMs.

CAMs can be divided into two categories depending on the number of states that can be stored in the memory cell, namely: binary CAM (BCAM) and ternary CAM (TCAM). BCAM stores a binary bit, namely '0' and '1', whereas TCAM can store three possible values, namely '1', '0', and 'don't care' (X). CAMs can be further categorized into two topologies, namely NOR and NAND type (see FIGS. 1C-1D). The stored bits are compared with the data on the search line (SL) and its complement (\SL) by XOR operation with the transistor network M1, M2, M3, and M4. To store data in a TCAM cell having a NOR-type architecture, data bit and the complement are stored in two SRAM cells.

The 'don't care' bit can be realized by storing '1' in both SRAM cells, i.e., D=\D=1. In the case of a match, both SL-D and \SL-\D paths are disconnected, and the match line remains precharged. In the case of miss, either of the SL-D or \SL-\D connect ML to ground, which discharges the precharged ML.

In a NAND-type architecture, TCAM cells are connected in series. Data bit D and \D are derived from a single SRAM cell, unlike two SRAM cells in a NOR-type TCAM. The stored bit is masked by using a mask bit (M) in a parallel SRAM cell.

In case of match, the precharged ML is connected to ground by series TCAM cells of the word by turning the NMOS transistor M1 'ON'. Storing the mask bit as '1' enables transistor M2, despite match or miss, which implements 'don't care' functionality. CMOS TCAM uses two SRAM cells, thereby doubling the area overhead, compared to conventional SRAM cells.

However, conventional CAMs suffer from area, power, and speed limitations. As it pertains to TCAM, the need to store and match a 'don't care' matching state requires two storage bits, which further worsens the area overhead. CMOS CAM is power hungry due to power consumed in match line (ML), search line, and leakage of the bit cell. In nanometer technologies, leakage power constitutes a major portion of the total power consumed in CAM memory. Non-volatile technologies, which are more area efficient than status random-access memory (SRAM) and can provide zero leakage, are attractive in such a scenario. However, continued improvement of TCAM is needed.

Accordingly, what is needed is improved area efficiency and non-volatility using MTJ-based TCAM for on-chip CAM applications. However, in view of the art considered as a whole at the time the present invention was made, it was not obvious to those of ordinary skill in the field of this invention how the shortcomings of the prior art could be overcome.

While certain aspects of conventional technologies have been discussed to facilitate disclosure of the invention. Applicant in no way disclaims these technical aspects, and it is contemplated that the claimed invention may encompass one or more of the conventional technical aspects discussed herein.

The present invention may address one or more of the problems and deficiencies of the prior art discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

SUMMARY OF THE INVENTION

In accordance with the present invention, a Magnetic Tunnel Junction (MJT) Ternary Content Addressable Memory (TCAM) employing six transistors and exhibiting reduced standby leakage and improved area-efficiency is provided. In the proposed TCAM, data can be written to the MJT devices by conventional current induced magnetization techniques and by controlling the source line, thereby eliminating the need for external writing circuitry.

In one embodiment of the invention, a Magnetic Tunnel Junction (MJT) Ternary Content Addressable Memory (TCAM) cell is provided comprising, a first Magnetic Tunnel Junction (MTJ) device having a first node coupled to a search line, a second MTJ device having a first node coupled between to a complement search line, a first match line discharge transistor having a gate coupled to a second node of the first MTJ device and a second match line discharge transistor having a gate coupled to a second node of the second MTJ device. The TCAM cell further includes, a first word line selection transistor having a drain coupled to the gate of the first match line discharge transistor and the second node of the first MTJ device, a second word line selection transistor having a drain coupled to the gate of the second match line discharge transistor and to the second node of the second MTJ device, a write access transistor having a drain coupled to a source of the first word line selection transistor and to the source of the second word line selection transistor and a search enable transistor having a drain coupled to a source of the first word line selection transistor and to the source of the second word line selection transistor.

In a particular embodiment, the first MTJ device and the second MJT device include, a first magnetic layer having a pined magnetization direction, a second magnetic layer having a free magnetization direction and a magnetic oxide disposed between the first magnetic layer and the second magnetic layer. In the MJT devices, a logic state of a bit stored in the TCAM cell is represented by the relative resistance of the first MJT device and the second MJT device.

In the TCAM cell of the present invention, the threshold voltage of the first match line discharge transistor and the threshold voltage of the second match line discharge transistor are greater than a voltage at the second node of the first MJT device and a voltage at the second node of the second MJT device during a match condition. In addition, the threshold voltage of the first match line discharge transistor or the threshold voltage of the second match line discharge transistor is less than a voltage at the second node of the first MJT device and a voltage at the second node of the second MJT device during a mismatch condition.

In a particular embodiment of the TCAM cell, the write access transistor is sized to provide a drain current that is greater than a critical write current of the first MJT device and the second MJT device during a write operation.

In an additional embodiment of the TCAM cell, a low resistance value of the first MJT device and the second MJT device and a size of the search enable transistor are selected to provide a search current that is below a critical current of the first MJT device and the second MJT device and in addition, a high resistance value of the first MJT device and the second MJT device is determined by the Tunnel Magneto Resistance (TMR) of the TCAM cell.

In accordance with an additional embodiment of the present invention, a Ternary Content Addressable Memory (TCAM) device, comprising a plurality of TCAM cells in accordance with the TCAM cell of the present invention is provided.

In an additional embodiment, a method for operating a Magnetic Tunnel Junction (MJT) Ternary Content Addressable Memory (TCAM) cell is provided, which includes precharging a match line of the TCAM cell to positive voltage supply level, wherein the match line is coupled to a drain of a first match line discharge transistor and to a drain of a second match line transistor, and wherein a gate of the first match line discharge transistor is coupled to a second node of a first MJT device and a gate of the second match line discharge transistor is coupled to a second node of a second MJT device. The method of operating the TCAM cell further includes, providing a ground voltage supply level to a gate of a write access transistor and to a source line coupled to a source of the write access transistor and providing a positive voltage supply level to a gate of search enable transistor and to a gate of a first word line selection transistor and a gate of a second word line selection transistor, wherein a source of the search enable transistor is coupled to the source line and a drain of the search enable transistor is coupled to a source of the first match line discharge transistor and to a source of the second match line discharge transistor. The method further includes providing search data on a search line and on a complement search line to be compared against data stored in the first MJT device and in the second MJT device, where a first node of the first MJT device is coupled to the search line and a first node of the second MJT device is coupled to the complement search line and turning the first match line discharge transistor and the second match line discharge transistor OFF to maintain a charge on the precharged match line if the search data matches the data stored in the first MJT device and in the second MJT device, or turning the first match line discharge transistor and the second match line discharge transistor ON to discharge the precharged match line.

In a particular embodiment, the method of operating the TCAM further includes, writing the data stored in the first MJT device and in the second MJT device, prior to precharging the match line. Writing the data further includes, providing a ground voltage supply level to the gate of the search enable transistor to disable the search enable transistor, providing a positive voltage supply level to the gate of the write access transistor, wherein a drain of the write access transistor is coupled to a source of the first wordline selection transistor and to a source of the second wordline selection transistor and providing a positive voltage supply level to a first word line coupled to the gate of the first wordline selection transistor or to a second word line coupled to the gate of the second wordline selection transistor for a selected word and controlling the search line to write stored data in the first MJT device and in the second MJT device provided by the search line and the complement search line.

In a particular embodiment for writing a logic "1", the method includes, providing a positive voltage supply level to the gate of the first wordline selection transistor and providing a ground voltage supply level to the gate of the second wordline selection transistor, providing a positive voltage supply level to the source line. The method of writing a logic "1" further includes, providing a ground voltage supply level to the search line to provide a write current to write an antiparallel state to the first MTJ device in the first cycle and providing a ground voltage supply level to the gate of the first wordline selection transistor, providing a positive voltage supply level to the gate of the second wordline selection transistor and providing a write current to write a parallel state to the second MTJ device, in a second cycle.

In an additional embodiment for writing a logic "0", the method includes, providing a positive voltage supply level to the gate of the first wordline selection transistor and providing a ground voltage supply level to the gate of the second wordline selection transistor, providing a positive voltage supply level to the source line and to the complement search line. The method for writing a logic "0" further includes, providing a ground voltage supply level to the search line to provide a write current from the search line to write a parallel state to the first MTJ device in a first cycle and providing a ground voltage supply level to the gate of the first wordline selection transistor, providing a positive voltage supply level to the gate of the second wordline selection transistor, providing a ground voltage supply level to the source line to providing a write current to write an antiparallel state to the second MTJ device, in a second cycle.

In a particular embodiment for writing logic "X", the method includes, providing a positive voltage supply level to the gate of the first wordline selection transistor and to the gate of the second wordline selection transistor, providing a positive voltage supply level to the source line, and providing a ground voltage supply level to the search line and to the complement search line to provide a write current from the search line to write an antiparallel state to the first MTJ device and to write an antiparallel state to the second MTJ device, in the same cycle.

Accordingly, the TCAM cell and method of operation of the TCAM cell, in accordance with various embodiments of the present invention provides improved area efficiency and non-volatility using MTJ-based TCAM for on-chip CAM applications. These and other important objects, advantages, and features of the invention will become clear as this disclosure proceeds.

The invention accordingly comprises the features of construction, combination of elements, and arrangement of parts that will be exemplified in the disclosure set forth hereinafter and the scope of the invention will be indicated in the claims.

BRIEF DESCRIPTION OF THE DRAWINGS

For a fuller understanding of the invention, reference should be made to the following detailed description, taken in connection with the accompanying drawings, in which.

DETAILED DESCRIPTION OF THE INVENTION

In the following detailed description of the preferred embodiments, reference is made to the accompanying drawings, which form a part thereof, and within which are shown by way of illustration specific embodiments by which the invention may be practiced. It is to be understood that other embodiments may be utilized and structural changes may be made without departing from the scope of the invention.

As used in this specification and the appended claims, the singular forms "a", "an", and "the" include plural referents unless the content clearly dictates otherwise. As used in this specification and the appended claims, the term "or" is generally employed in its sense including "and/or" unless the context clearly dictates otherwise.

The present invention is directed to a non-volatile NOR type TCAM cell using MTJ devices. The TCAM employs only 6 transistors and 2 MTJ devices, instead of 16 transistors, as is commonly known in the current state of the art for CMOS TCAM devices.

Figure 1A:
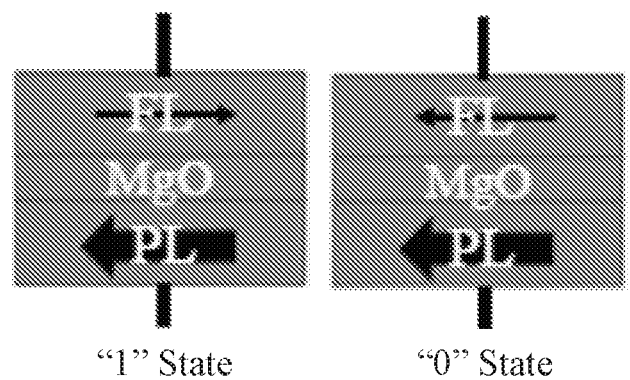
FIG. 1A depicts MTJ devices in anti-parallel ('1") and parallel ('0') state.
Figure 1B:
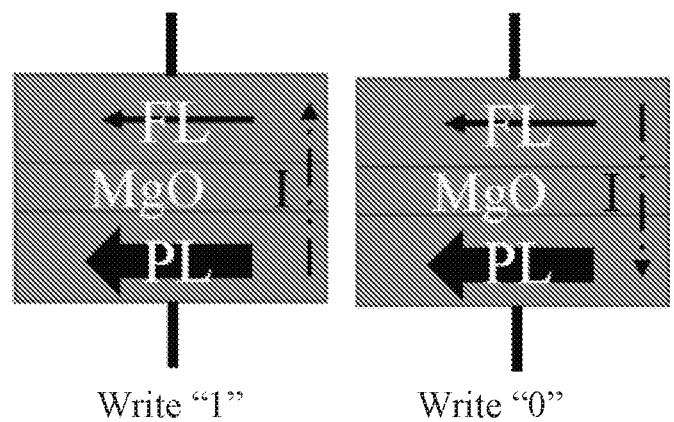
FIG. 1B depicts the directions of charge current to write '1' and to write '0'.
Figure 2:
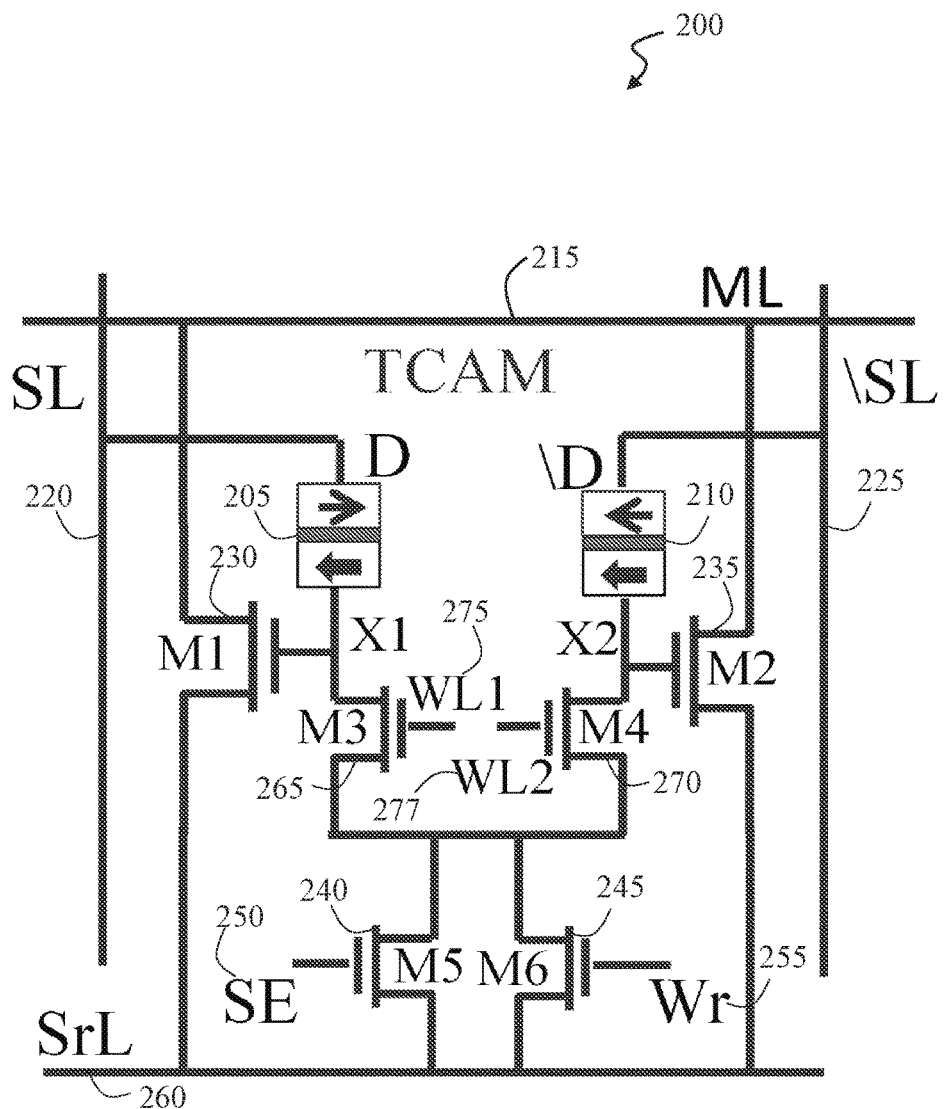
FIG. 2 is a schematic diagram of a Ternary Content Addressable Memory (TCAM) cell, in accordance with an embodiment of the present invention.

With reference to FIG. 2, a Magnetic Tunnel Junction (MJT) Ternary Content Addressable Memory (TCAM) cell 200, in accordance with an embodiment of the present invention includes, a first Magnetic Tunnel Junction (MTJ) device 205 having a first node coupled to a search line 200 and a second MTJ device 210 having a first node coupled between to a complement search line 225. The TCAM cell further includes, a first match line discharge transistor 230 having a gate coupled to a second node of the first MTJ device 205 and a second match line discharge transistor 235 having a gate coupled to a second node of the second MTJ device 210. The TCAM cell additionally includes, a first word line selection transistor 265 having a drain coupled to the gate of the first match line discharge transistor 230 and the second node of the first MTJ device 205 and a second word line selection transistor 270 having a drain coupled to the gate of the second match line discharge transistor 235 and to the second node of the second MTJ device 210. The TCAM cell further includes a write access transistor 245 having a drain coupled to a source of the first word line selection transistor 265 and to the source of the second word line selection transistor 270 and a search enable transistor 240 having a drain coupled to a source of the first word line selection transistor 265 and to the source of the second word line selection transistor 270. As shown in FIG. 2, the first match line discharge transistor 230 further includes a drain coupled to a match line 215 and a source coupled to a source line 260 and wherein the second match line discharge transistor 235 further includes a drain coupled to the match line 215 and a source coupled to the source line 260. In addition, a gate of the first word line selection transistor 265 is coupled to a first word line 275 and a gate of the second word line selection transistor 270 is coupled to a second word line 277.

In order to enable writing to the first MJT device 205 and the second MJT device 210, a gate of the write access transistor 245 is coupled to a write signal 255 and a source of the write access transistor is coupled to the source line 260. In order to enable searching of the first MJT device 205 and the second MJT device 210, a gate of the search enable transistor 240 is coupled to a search enable signal 250 and a source of the search enable transistor 240 is coupled to the source line 260.

In operation of the TCAM cell 200 illustrated in FIG. 2, the two (2) MTJ devices 205, 210 store data D and complement data \D, respectively. Match line discharge transistors M1 230 and M2 235 form a match line (ML) discharge network to discharge a precharged match line 215, depending upon the result of a data comparison with the search lines SL 220 and \SL 225. During a search, transistors M3 265 and M5 240 and M4 270 and M5 240, along with the MTJs 205, 210, form a voltage divider network in which the drain voltages of M3 265 and M4 270 drive the gates of discharge transistors M1 230 and M2 235, respectively.

The TCAM cell of the present invention is designed in such a way that during a match condition, the voltage of node X1 at the gate of discharge transistor M1 230 and the voltage of node X2 at the gate of discharge transistor M2 235 are below the threshold voltage of M1 230 and M2 235, and as such, the match line (ML) 215 remains precharged. However, during a mismatch condition, the voltage of X1 rises above the threshold of M1 230 or the voltage of X2 rises above the threshold voltage of M2 235, thus discharging the match line 215.

Transistor M3 265 and M4 270 are the wordline (WL1 and WL2) selection transistors, and transistor M6 245 is the write access transistor that turns ON only during a write (WR) operation. Transistor M6 245 can be sized larger to allow sufficient write current. Transistor M5 240 is driven by Search Enable (SE) signal 250 and is sized to limit the MTJ 205, 210 current to provide a read disturb free search operation. The 'don't care' bit can be stored in the cell by storing '1' in both D and \D bits. The search bit can be masked by driving SL=\SL=0 on the search lines 220, 225. The Source Line (SrL) 260 is used for two purposes, namely (1) write operation when the SrL 260 is connected to 0 or $V_{dd}$ depending on the write data to the MTJs 205, 210; and (2) search operation when SrL 260 is driven to 0 to allow voltage division.

In the TCAM cell of the present invention, two match cases exist, namely (1) (D, \D)=(SL, \SL)=(1, 0); and (2) (D, \D)=(SL, \SL)=(0, 1). Since both cases are substantially similar, only the first case is explained herein. For (D, \S)=(1, 0), the left side MTJ 205 is in high resistance ($R_H$) state whereas the right side MTJ 210 is in low resistance ($R_L$) state. Since (SL, \SL)=(1, 0), the voltage at node X1 is $$V_{X1} = V_{sl} * \frac{r}{R_H + r} = V_M$$

and the voltage at node X2 is 0. In this expression, r is the lumped ON resistance of transistors M3 265 and M5 240, and $V_{sl}$ is SL voltage. To keep transistor M1 230 OFF during match, $V_{X1}$ should be lower than $V_{th0}$ (i.e., the threshold voltage of M1 230 and M2 235).

For the mismatch there are two cases, namely (1) (D, \D)=(1, 0) and (SL, \SL)=(0, 1); and, (2) (D, \D)=(0, 1) and (SL, \SL)=(1, 0). For the first case, the voltage at node X1 is 0, whereas voltage at X2 is $$V_{X2} = V_{\setminus sl} * \frac{r}{R_L + r} = V_{MM}$$

where $V_{\setminus sl}$ is \SL voltage. To keep transistor M2 235 ON during mismatch, $V_H$ should be higher than $V_{th0}$. Similar analysis applies to the $2^{nd}$ case as well.

From the above equations $V_{MM} > V_M$ for the two cases as $R_H > R_L$. For the design to function properly (i.e., discharge ML during a mismatch condition at a higher speed compared to that of a match condition), $R_H$, $R_L$, and r should be selected such that $V_M < V_{th0} < V_{MM}$. The following analytical equations can be used to quantify the design parameters.

$$V_{MM} = V_{dd} - I_{MM} * R_L = V_{\setminus sl} * \frac{r}{R_L + r} = V_{th0} + \Delta_1 \quad (1)$$

$$V_M = V_{dd} - I_M * R_H = V_{sl} * \frac{r}{R_H + r} = V_{th0} - \Delta_2 \quad (2)$$

IMM and IM are the currents drawn from SL and \SL in case of mismatch and match, respectively, and Δ1, Δ2 are the offset voltages with respect to $V_{th0}$. Subtracting Eqs. (1) and (2) and using RH=RL*(1+TMR), the following is obtained:

$$V_{MM} - V_M = V_{dd}\left(\frac{r}{R_L + r} - \frac{r}{R_H + r}\right) = \Delta_1 + \Delta_2 \quad (3)$$

$$V_{MM} - V_M = V_{dd}\left(\frac{rR_L TMR}{(R_L + r)(R_L(1 + TMR) + r)}\right) = \Delta_1 + \Delta_2 \quad (4)$$

As such, the TCAM cell in accordance with the present invention an be optimized using three primary approaches: (1) maximizing the difference between mismatch and match voltages i.e., (Δ1+Δ2); (2) maximizing the absolute values of offsets from $V_{th0}$, i.e., |Δ1| and |Δ2| to keep M1/M2 strongly ON or OFF as needed during mismatch and match, respectively, and (3) lowering the search current below critical write current of MTJ.

Figure 3:
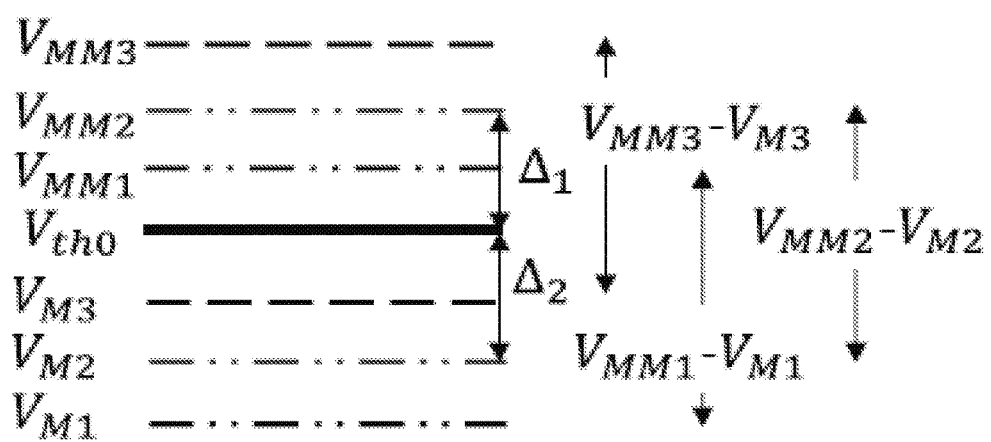
FIG. 3 is a $V_{gs}$ margin diagram illustrating best and worst $V_M$ and $V_{MM}$ with respect to $V_{th0}$, in accordance with an embodiment of the present invention.

From Eq. (4), it can be concluded that higher TMR, higher $R_H$, and higher r can be employed to enhance (Δ1+Δ2). Although higher r and $R_L$ is also good for maximizing Δ1, it minimizes Δ2. A lower Δ2 can turn ON M1/M2 during match, degrading the sense margin. FIG. 3 illustrates a $V_{gs}$ margin diagram illustrating the best and worst $V_M$ and $V_{MM}$ with respect to $V_{th0}$.

The voltages $V_{MM1}$, $V_{MM3}$, $V_{M1}$ and $V_{M3}$ provide poor sense margin compared to $V_{MM2}$ and $V_{M2}$, even with the same magnitude of Δ1+Δ2. The ideal margin is obtained when $R_H = \infty$ and $R_L = 0$, which gives $V_{MM} = V_{dd}$ and $V_M = 0$. However, a lower $R_L$ could be detrimental for read disturb due to the resulting high search current conditions. High values of $R_H$ and $R_L$ ensure low search line currents. This, in combination with high TMR can provide better $V_{gs}$ margin, i.e., (Δ1+Δ2) with low search power consumption.

In the TCAM of the present invention 200, the search lines SL 220 and \SL 225 are used to write data to the MTJ devices 205, 210. Table 1 summarizes the states of the control signals in the write operation. Writing '1' and '0' requires two cycles to write to the two MTJs 205, 210 while 'X' can be written in a single cycle. During a write the ML precharge is disabled to avoid power consumption from the ML 215. This is achieved by pulling the 'precharge' signal high. NMOS transistor M6 245 is turned ON during write by WR signal 255. Note that M6 245 is sized to provide a drain current greater than the critical write current of the MTJ devices 205, 210. The search enable signal SE 250 is pulled to ground which disables transistor M5 240. The $WL_x$ is turned ON only for the selected word so that the unselected cells are unaffected. The source line SrL 260 is controlled appropriately to write a '1' or '0'.

Figure 4A:
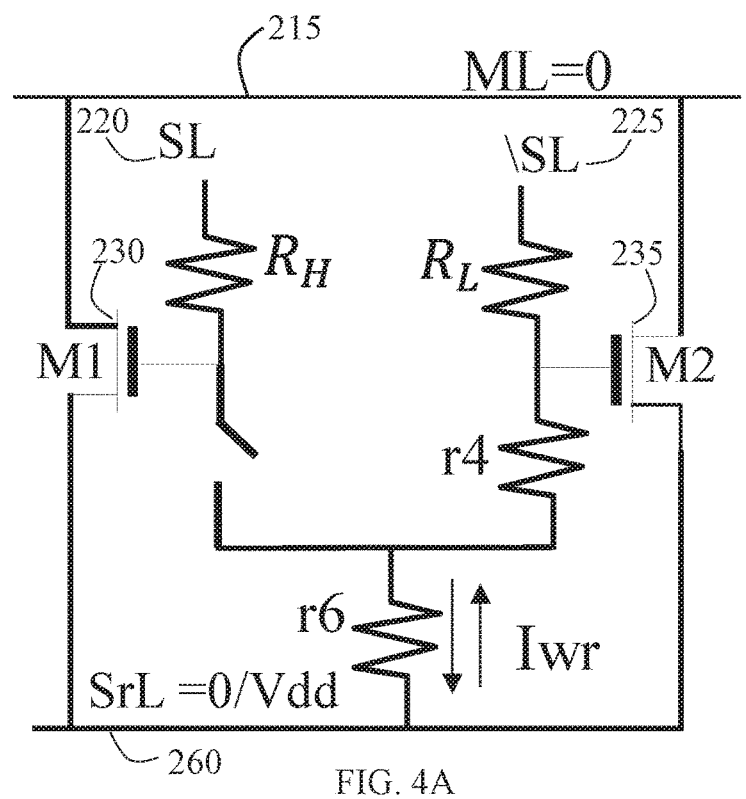
FIG. 4A is a schematic diagram illustrating an equivalent circuit during write operation of the TCAM cell, where MTJ resistance is $R_H$ (D='1') on the left side image and MTJ resistance is $R_L$ (\D-'0') on the right side image, in accordance with an embodiment of the present invention.

FIG. 4A illustrates the equivalent circuit of the TCAM cell during write to /D bit. The transistors are replaced with equivalent ON resistances. Resistors r3, r4 and, r6 are equivalent resistors of M3 265, M4 270 and M6 245, respectively. The writing operation is described below. In the first cycle, writing to D bit is enabled by pulling WL1 275 to $V_{dd}$ and path to \D is disabled by pulling WL2 277 to ground. In the second cycle of write operation, writing to \D bit is enabled by pulling WL2 277 to $V_{dd}$ and D bit path is disabled by pulling WL1 275 to ground.

TABLE 1

States of control signals TCAM memory operations

| | Write operation: WR = $V_{dd}$, SE = 0 | | | | | |
|---|---|---|---|---|---|---|
| | Write D bit WL1 = $V_{dd}$, WL2 = 0 | | | Write \D bit WL1 = 0, WL2 = $V_{dd}$ | | |
| | SL | \SL | SrL | SL | \SL | SrL |
| Write '1' | 0 | X | $V_{dd}$ | X | $V_{dd}$ | 0 |
| Write '0' | $V_{dd}$ | X | 0 | X | 0 | $V_{dd}$ |
| Write 'X' | 0 | 0 | $V_{dd}$ | WL1 = WL2 = $V_{dd}$ | | |

| | Search operation: WL1 = WL2 = $V_{dd}$, WR = 0, SE = $V_{dd}$ | | |
|---|---|---|---|
| | SL | \SL | SrL |
| Search '1' | $V_{dd}$ | 0 | 0 |
| Search '0' | 0 | $V_{dd}$ | 0 |
| Search 'X' | 0 | 0 | 0 |

1. Writing '1': In the first cycle, SrL 260 is pulled high and SL 220 line is pulled to ground. The write current flows from SL 220 writing antiparallel state to the first MTJ device 205 storing bit D. There is no current through the other MTJ device 210 as the WL2 277 control signal is at zero potential. In the second cycle the SrL 260 is held high, SL 220 is pulled to $V_{dd}$ and \SL 225 is pulled low which programs the second MTJ device 210, storing \D to parallel state. There is no current through the other MTJ 205 as SL 220 and SrL 260 are both high.

2. Writing '0': In the first cycle, the SrL 260 and \SL 225 are pulled high and the SL 220 line is pulled low. The first cycle writes parallel magnetization state to MTJ storing D bit. In the second cycle, the SrL 260 is pulled low while retaining the states of SL 220 and \SL 225 at 0 and $\V_{dd}$, respectively, which programs the \D bit to antiparallel state.

3. Writing 'X': The 'X' state can be stored by writing logic 1 to both D and \D. Both the word lines WL1 275 and WL2 277 are pulled high. The SrL 260 is pulled to $V_{dd}$ and the search lines SL 220 and \SL 225 are pulled to ground. The current flows through both the MTJ devices 205, 210 storing antiparallel states to D and \D.

Figure 4B:
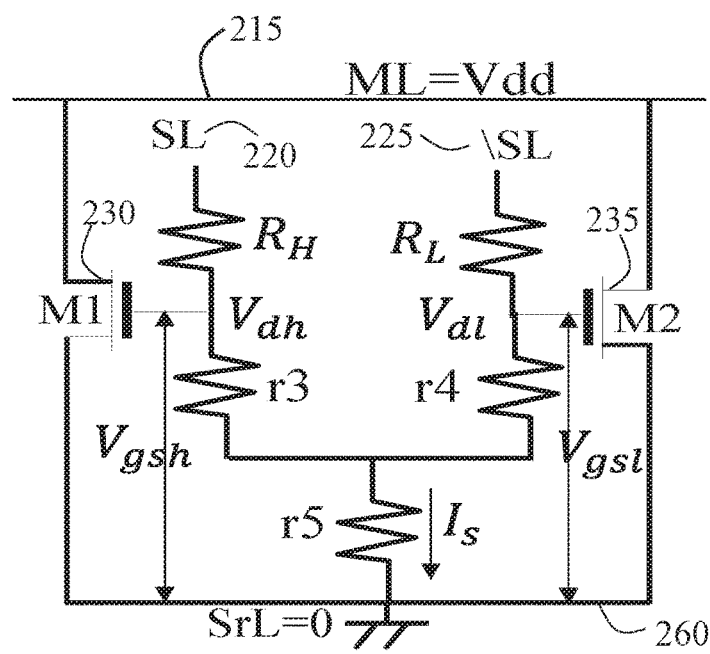
FIG. 4B is a schematic diagram illustrating an equivalent circuit during search operation of the TCAM cell, in accordance with an embodiment of the present invention.

In the TCAM cell of the present invention, search is a single cycle operation. The ML 215 is precharged to $V_{dd}$ and WR 255 is pulled to ground. The SrL 260 is pulled to ground throughout the search operation. Next, SE 250, WL1 275 and WL2 277 are pulled high to enable the conducting path through M5 240, M3 265 and M4 270 (Table 1). Either $V_{MM}$ or $V_M$ voltage is developed depending on the match or mismatch, respectively, at the gate of M1 230 or M2 235. The search line SL 220 is pulled to Vdd and complement search line \SL 225 is pulled low to search a logic '1'. Similarly, SL 220 is pulled low an, \SL 225 is pulled to Vdd to search for logic '0'. Both SL 220 and \SL 225 are pulled low to search 'X'. Circuit operation in match and mismatch cases are discussed below. FIG. 4B shows the equivalent circuit during search operation.

1. Match: Let (D, \D)=(SL, \SL)=(1, 0). Voltages $V_{X_1}$ and $V_{X_2}$ are given by $$V_{X1} = V_{dh} = V_{dd} * \frac{r3 + r5}{R_H + r3 + r5}$$

$$V_{X2} = V_{dl} = V_{dd} * \frac{r5 + R_L}{(R_H + r3 + r5)(r4 + r5)}$$

It should be noted that $V_{X2}$ is less than $V_{X1}$ and appears due to the potential across r5 which results in a current though $R_L$ even when \SL=0. The transistors M3 265 and M5 250 are sized such that $V_{X1}<V_{th0}$. So M1 230 and M2 235 are turned OFF and the ML 215 remains precharged. The other match case i.e., (D, \D)=(SL, \SL)=(0, 1) is similar.

2. Mismatch: Let (D, \D)=(1, 0) and (SL, \SL)=(0, 1). Then, $$V_{X1} = V_{dl} = V_{dd} * \frac{r4 + r5}{R_L + r4 + r5}$$

$$V_{X2} = V_{dh} = V_{dd} * \frac{r5 + R_H}{(R_H + r3)(R_L + r4 + r5)}$$

$V_{dl}$ (mismatch)>$V_{th0}$>$V_{dh}$ (match). Under these conditions both M1 230 and M2 235 are turned ON to discharge the precharged ML 215 which provides better sense margin.

Figure 5:
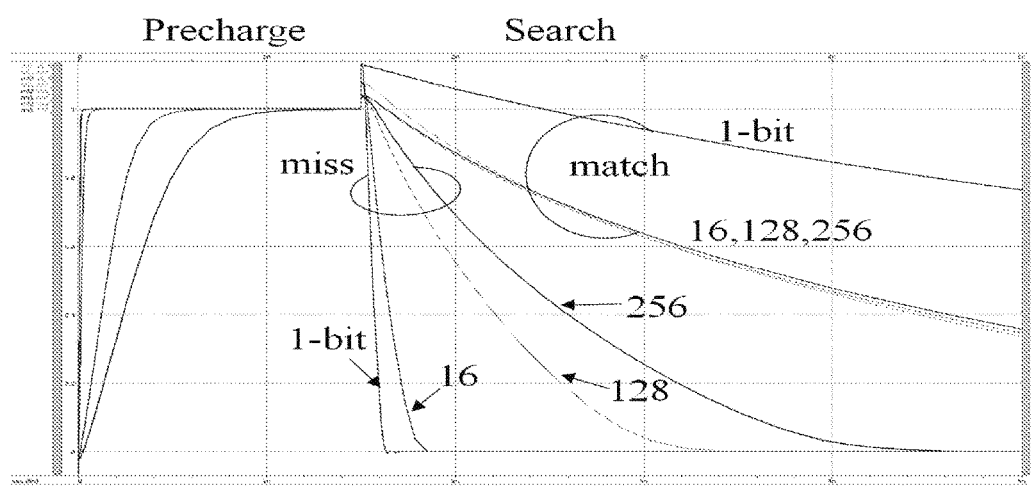
FIG. 5 illustrates a waveform showing the search operation of the TCAM cell, in accordance with an embodiment of the present invention.

FIG. 5 illustrates the ML 215 voltages during search operation for the TCAM cell of varied word sizes, namely 1, 16, 128 and 256-bit for match and mismatch. Predictive 22 nm model is used for simulations. The waveforms correspond to the worst case sense margin (i.e., single miss in the whole word). The rate of discharge of ML line 215 in match case increases with the word size due to the increased number of cells leaking the ML current through weakly driven M1 230 and M2 235. This in turn limits the sense margin for larger word sizes.

The low MTJ resistance and sizing of the sense enable transistor M5 240 are chosen to keep the search current below the critical current while providing a sufficient $V_{gs}$ to drive M1 230 and M2 235 in order to differentiate the miss and match cases. The high MTJ resistance is determined by the Tunnel Magneto Resistance (TMR).

The write access transistor M6 255 is sized to provide greater than critical current to the MTJ during write operation. A range of $R_L$ (5 k to 9 k) was simulated with fixed TMR of 100%. The trend is shown in the FIG. 6A, for a 16-bit word. It can be observed from the plot that high resistance values with smaller NMOS widths provide good sense margin (close to $V_{dd}/2$) with lower MTJ current from the search line. Based on this, $R_L$=8 kΩ is selected for the current design. The MTJ current during mismatch is also plotted. It should be noted that mismatch current is always greater than the match current, and thus it was considered for estimating the worst case read disturb during search operation.

Figure 6A:
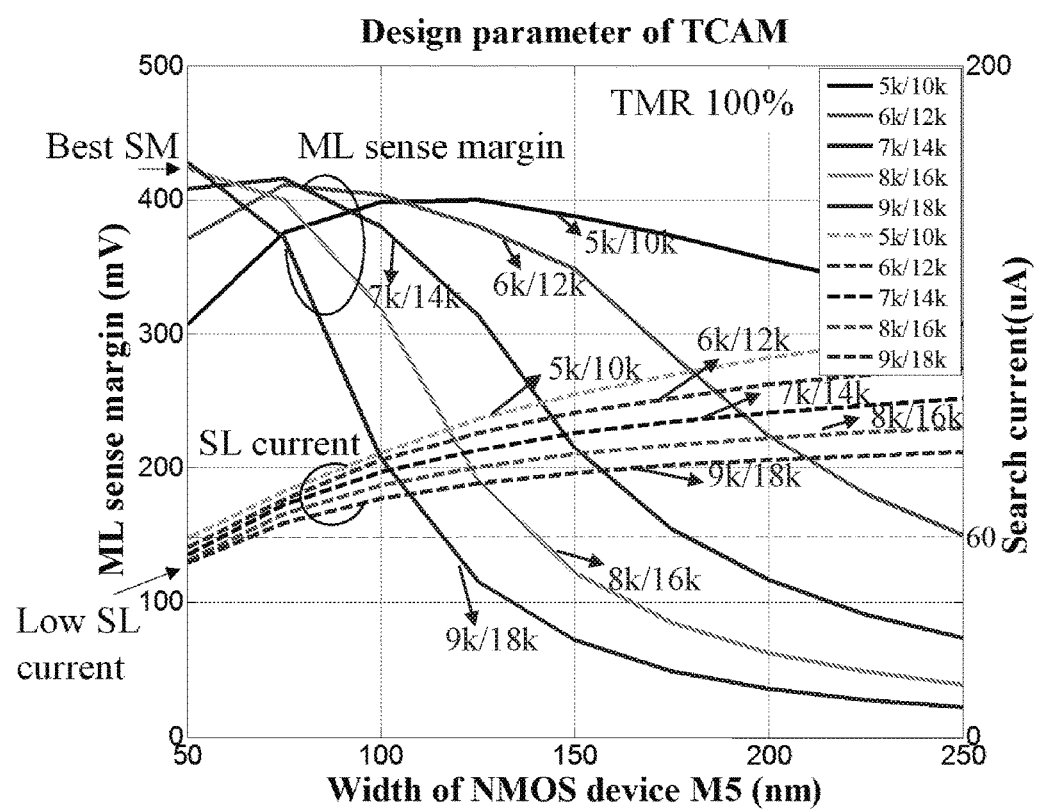
FIG. 6A is a graphical illustration depicting width of transistor M5 vs. sense margin and MTJ device current from SL for various $R_L$ (TMR=100%), in accordance with an embodiment of the present invention.

Width of the NMOS devices M3 265, M4 270 and M5 240 are important parameters to ensure low search current and reduce the power dissipated from the search lines. The plot in the FIG. 6A shows the distribution of MTJ current for various widths of the NMOS device M5 240 with different $R_L$ values. Smaller width of NMOS devices offers higher resistance, reduces search current (good for lower read disturb and power) and also improves the sense margin. However, minimum sized transistor can be susceptible to manufacturing process variations.

Figure 6B:
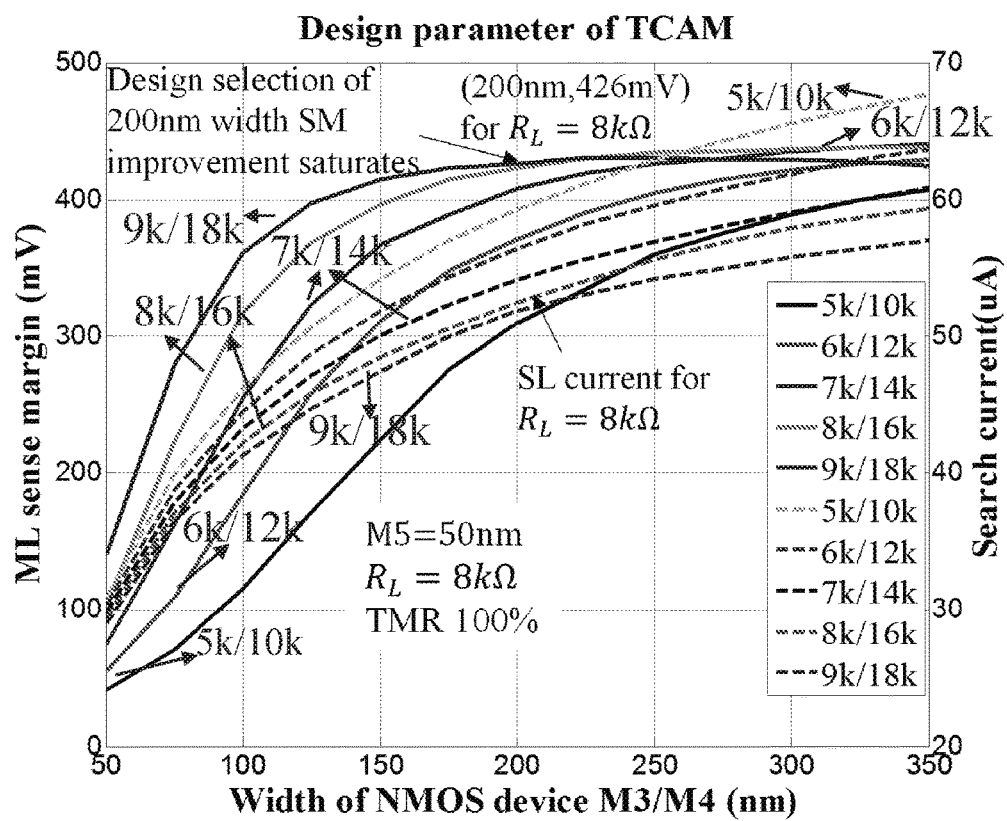
FIG. 6B is a graphical illustration depicting width of M3/M4 vs. sense margin and search current for various $R_L$, in accordance with an embodiment of the present invention.

In an exemplary embodiment, a width of 50 nm was selected for M5 240 for the low search current and process variation tolerance, respectively. It can be observed from the plot in FIG. 6A that miss case current is highly dependent upon the width of the M5 NMOS device 240 and remains almost the same for different $R_L$ values. In this embodiment, high $R_L$ is selected to keep the TMR within practical limits, 100%-150%. To determine the optimal size of transistors M3 265 and M4 270, the size was swept and the sense margin and sense current was observed for 50 nm M5 240 width, as illustrated in FIG. 6B. It is evident from the plot of FIG. 6B that the sense margin increases sharply from 50 nm up to 200 nm. After 200 nm, improvement in the sense margin saturates. Also, the search current increases by approximately 10× with increase in the width by 25 nm. Thus, in an exemplary embodiment, the width of M3 365 and M4 270 was selected to be 200 nm.

Figure 7:
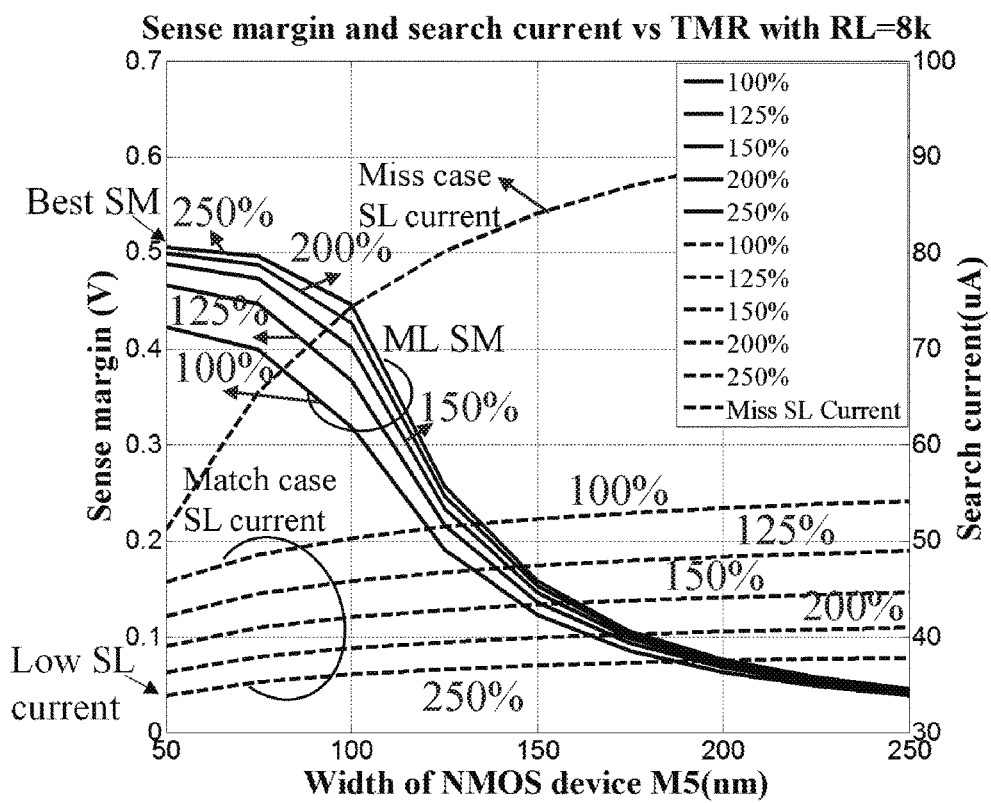
FIG. 7 is a graphical illustration depicting ML sense margin and search current from search line with respect to the width of NMOS M5 for different TMR values, in accordance with an embodiment of the present invention.

FIG. 7 illustrates the trend of match current and sense margin versus width of NMOS M5 240 for different TMR values. The $R_L$ of MTJ is fixed to 8 K for this analysis and TMR and $R_H$ are selected for low match case search current and higher sense margin. It can be seen that higher TMR ensures better sense margin and low MTJ match current with fixed $R_L$. It can be seen from the plot of FIG. 7 that the NMOS width does not affect the MTJ current compared to that in the miss case because of the fact that the MTJ high resistance $R_H$ dominates the effective NMOS resistance of M3 365, M4 270 and M5 240. This also results in low drain voltage at M3 365 and M4 270 compared to that in the mismatch case. So, the width of the NMOS devices is selected based on the mismatch current drawn from the SL, while the TMR is chosen to satisfy the match case conditions. It can be noted that the sense margin benefit of a TMR greater than 125% saturates. Hence, TMR=125% has been used and provides less than 45 µA of match current with a sense margin close to 500 mV.

Resistance of an MTJ device is shown to depend upon oxide thickness and surface area of free layer. Therefore by tuning these parameters it is possible to obtain an MTJ device resistance of $R_L$=8 kΩ. Similarly, it has been experimentally shown that TMR could be improved up to 236%. This can be used during design time to ensure TMR=125% for proper functioning of the current TCAM cells.

To simulate the results of the exemplary TCAM cell of the present invention, TMR=125% was used with $R_L$=8 kΩ, 50 nm M5 transistor 240 and 200 nm M3 365 and M4 270 transistors. MTJ models were selected with 29 nm×22 nm×3 nm free layer dimension and 0.876 nm oxide (MgO) thickness for design simulations. Word size of 16, 32, 64, 128 and 256-bit was simulated to analyze the design with respect to process, temperature and voltage variations.

Figure 8A:
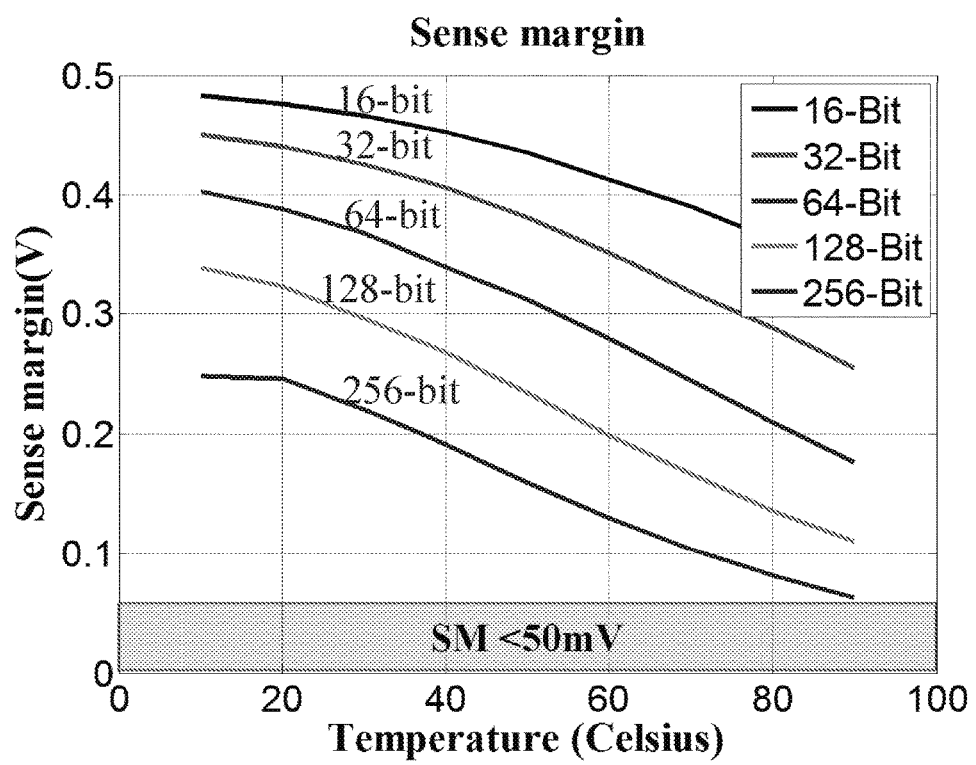
FIG. 8A is a graphical illustration depicting the worst case sense margin from 10° C. to 90° C., for different word sizes, in accordance with an embodiment of the present invention.
Figure 8B:
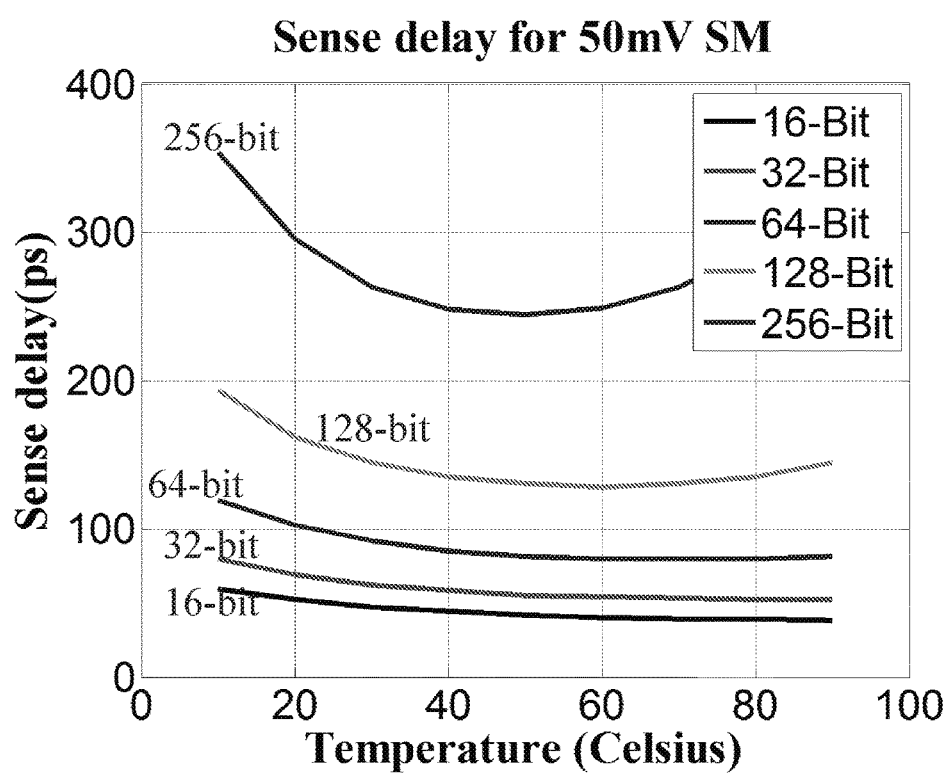
FIG. 8B is a graphical illustration depicting the worst case sense delay (for 50 mV sense margin development) from 10° C. to 90° C., for different word sizes, in accordance with an embodiment of the present invention.
Figure 8C:
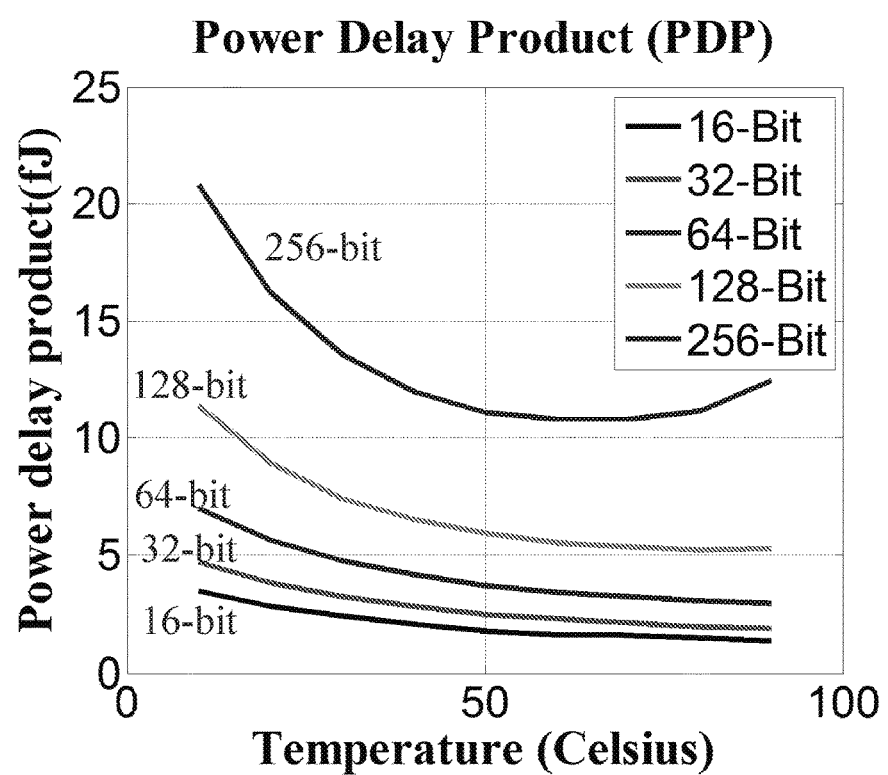
FIG. 8C is a graphical illustration depicting the worst Power Delay Product (PDP) per bit search from 10° C. to 90° C., for different word sizes, in accordance with an embodiment of the present invention.

The worst case sense margin, sense delay (for 50 mV sense margin development) and the Power Delay Product (PDP) per bit search from 10° C. to 90° C. are shown in FIGS. 8A-8C for different word sizes. A single bit mismatch is considered for sense margin and sense delay as it is the worst case condition. The sense delay increases proportionally as the word size due to increment in ML interconnect capacitance. As the temperature increases, the rate of ML 215 discharge increases due to lowering of threshold voltage of the discharge transistors M1 230 and M2 235.

Sense margin decreases with temperature due to ML 215 discharge through subthreshold leakage current of discharge transistors in the match case. Therefore, the sense delay (for 50 mV sense margin) increases as the temperature increases. The PDP is proportional to the change in sense delay while the operating voltage and the search line current are similar across different temperatures. From FIGS. 8A-8C, a reliable sense margin of greater than 50 mV across the range of temperature till 256-bit word size was obtained.

Figure 9A:
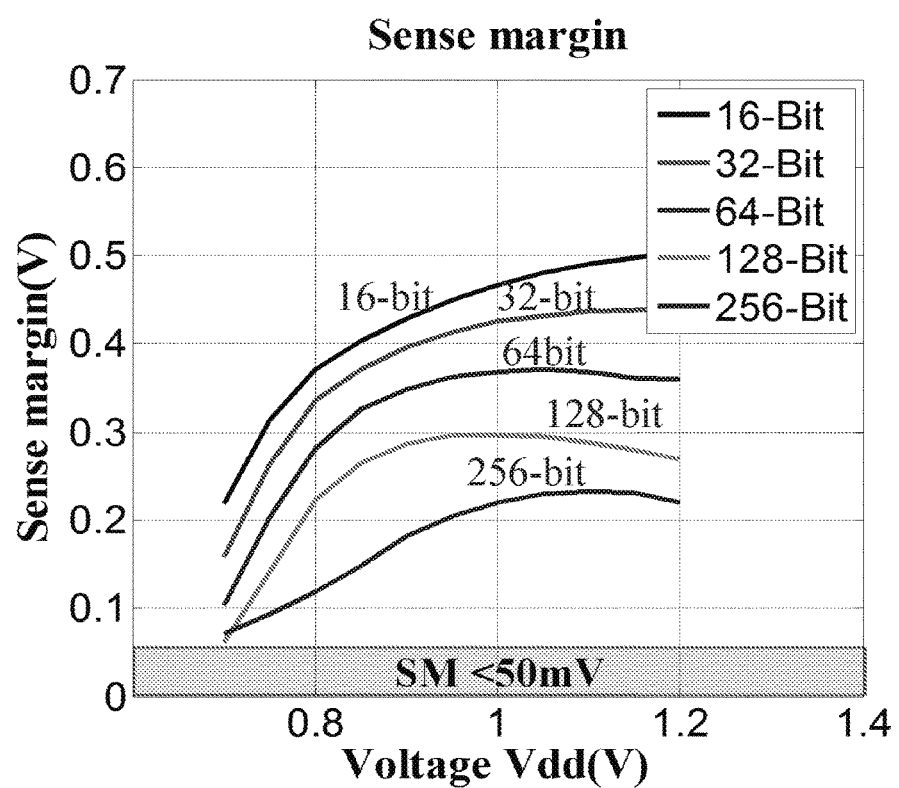
FIG. 9A is a graphical illustration of the sensitivity of the sense margin when the operating voltage is varied from 0.7V to 1.2V, in accordance with an embodiment of the present invention.
Figure 9B:
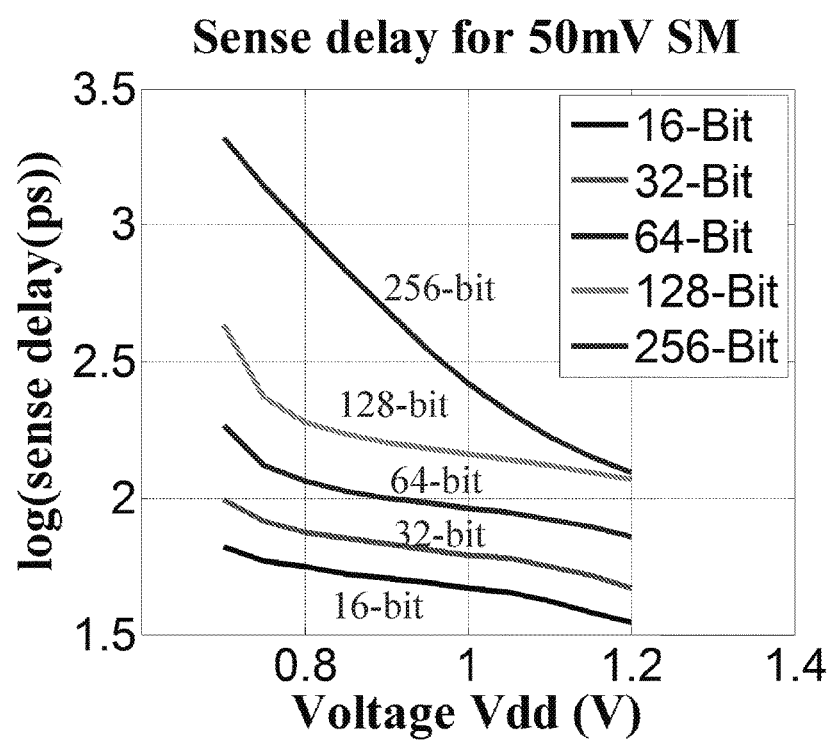
FIG. 9B is a graphical illustration of the sensitivity of the sense delay when the operating voltage is varied from 0.7V to 1.2V, in accordance with an embodiment of the present invention.
Figure 9C:
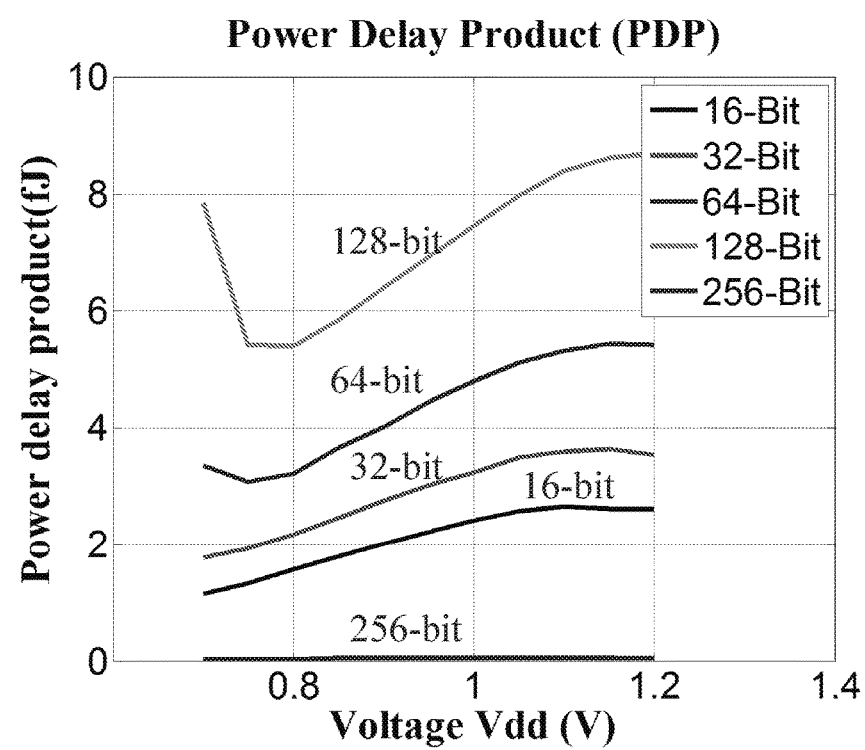
FIG. 9C is a graphical illustration of the sensitivity of the PDP per bit search when the operating voltage is varied from 0.7V to 1.2V, in accordance with an embodiment of the present invention.

In this exemplary embodiment, the operating voltage is varied from 0.7V to 1.2V to observe the sensitivity of sense margin, sense delay and PDP per bit search, as illustrated in FIGS. 9A-9C. A 50 mV sense development time is used to measure the sense delay. Below 0.7V the sense margin of 256-bit CAM word is less than 50 mV. Sense margin and sense delay are sensitive to $V_{dd}$ due to lowering of gate voltage of M1 230 and M2 235, while their threshold voltages remain fixed. At lower voltages the M1 230 and M2 235 transistors fail to turn ON, or weakly conduct, even during mismatch, thereby degrading the sense margin (especially for wider words). Sense delay for a 256-bit TCAM word varies from 124 ps at 1.2V to 2.098 ns at of 0.7V (sense delay is plotted in log 10 scale). The increase in the sense delay results in a sharp increase in the PDP, at 0.7V.

Figure 10A:
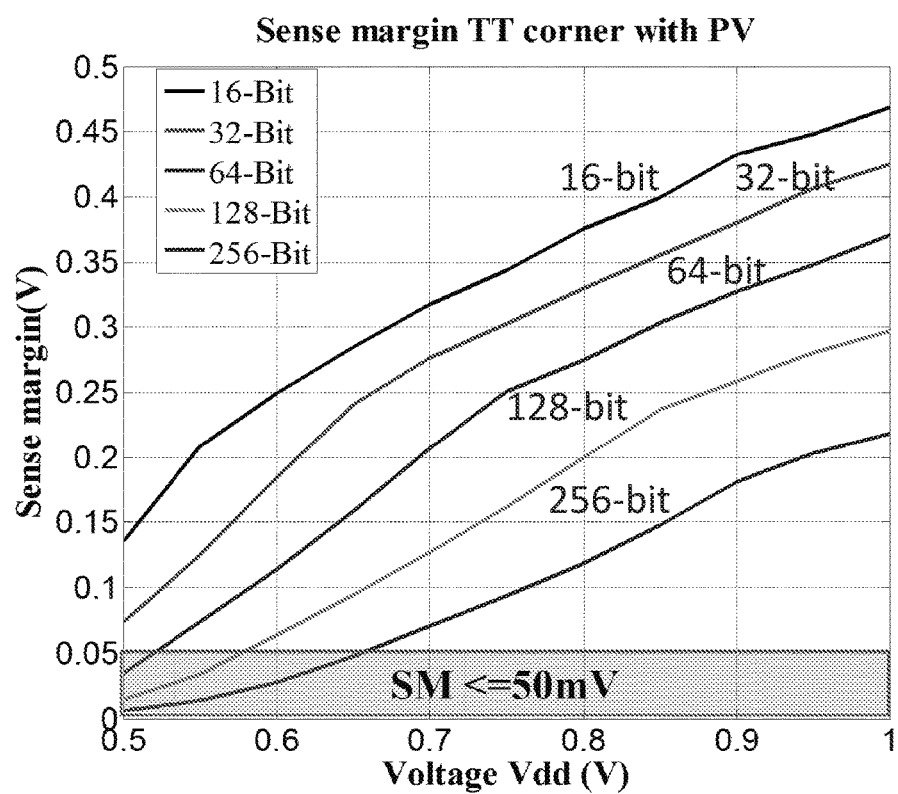
FIG. 10A is a graphical illustration of the worst case sense margin for different supply voltages at typical-typical (TT) corner, in accordance with an embodiment of the present invention.
Figure 10B:
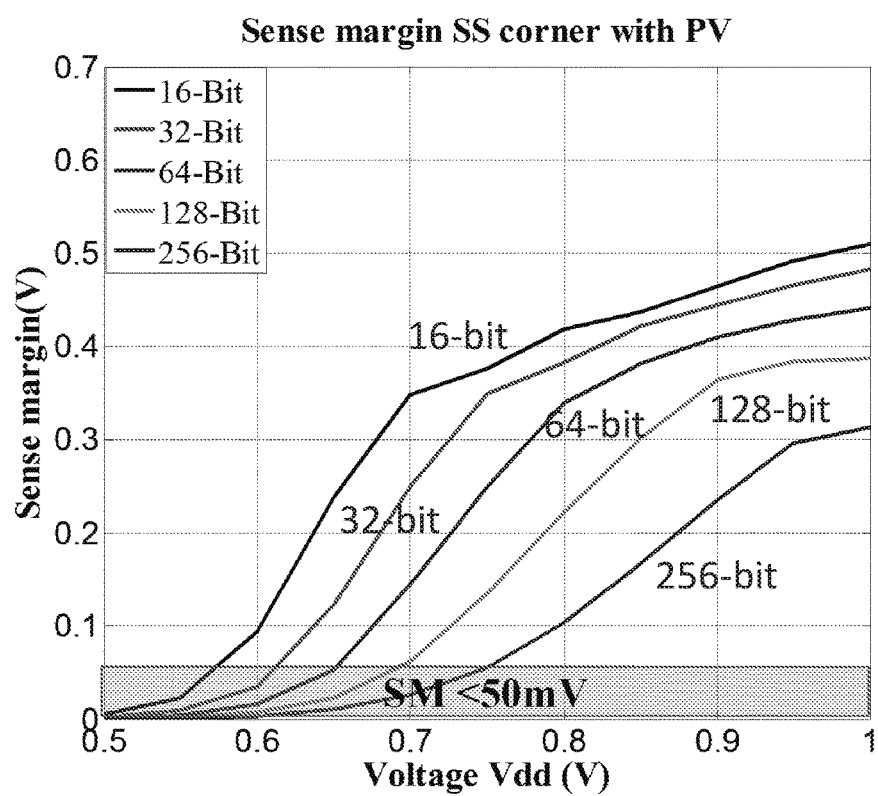
FIG. 10B is a graphical illustration of the worst case sense margin for different supply voltages at slow-slow (SS) corner, in accordance with an embodiment of the present invention.
Figure 10C:
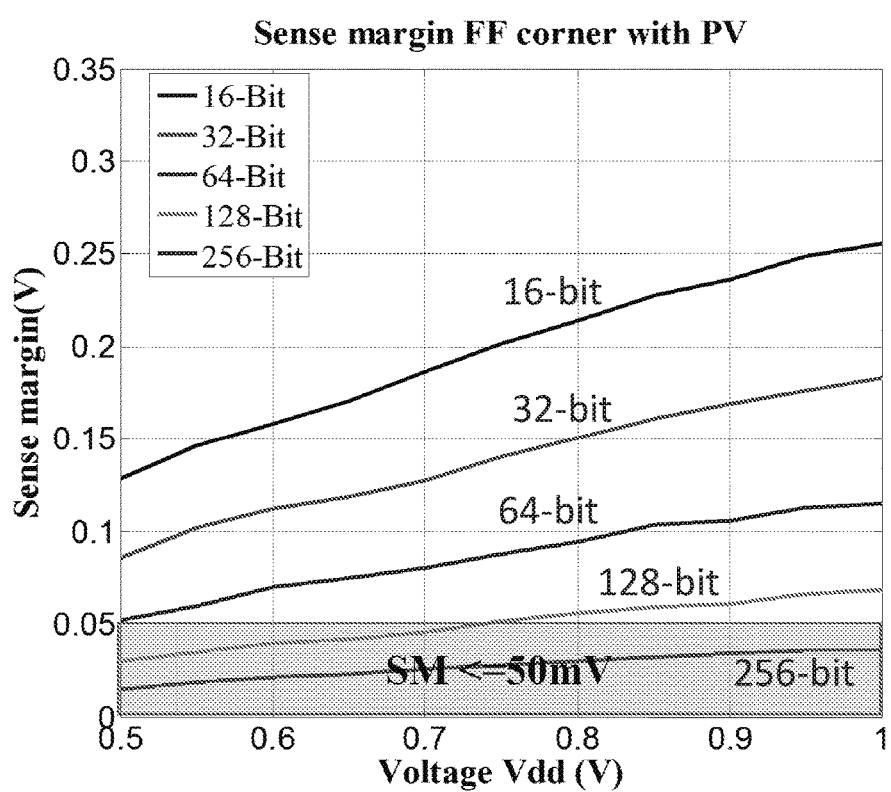
FIG. 10C is a graphical illustration of the worst case sense margin for different supply voltages at fast-fast (FF) corner, in accordance with an embodiment of the present invention.

For process variation analysis of the exemplary embodiment, fast-fast (FF), slow-slow (SS), and typical-typical (TT) corners were considered. The process variation was modeled by lumping the variation in channel length, oxide thickness, flat band conditions, etc., into threshold voltage of the transistor. The SS (FF) is simulated by adding (subtracting) 150 mV from nominal threshold voltage. The worst case sense margin is plotted for different supply voltages at TT, SS and FF corners, as shown in FIGS. 10A-10C. It can be observed that the embodiment of the TCAM cell can provide a reliable sense margin of above 50 mV at all corners till 0.75V for 128-bit words or less. The poor sense margin at lower voltages is linked with poor $V_{gs}$ across M1 230 and M2 235 that keeps the ML 215 precharged, even in mismatch conditions.

The 256-bit word fails to provide adequate sense margin in FF corner at 1V. This is primarily due to poor Δ2 when $V_{th0}$ moves down coupled with leakage from the match bits, as shown in FIG. 4. Thus, bit match and mismatch bits leak, thereby degrading the sense margin. As such, threshold voltage modulation and search enable (SE) voltage boosting or underdrive was shown to improve sense margin for 256-bit word simulations.

Figure 11A:
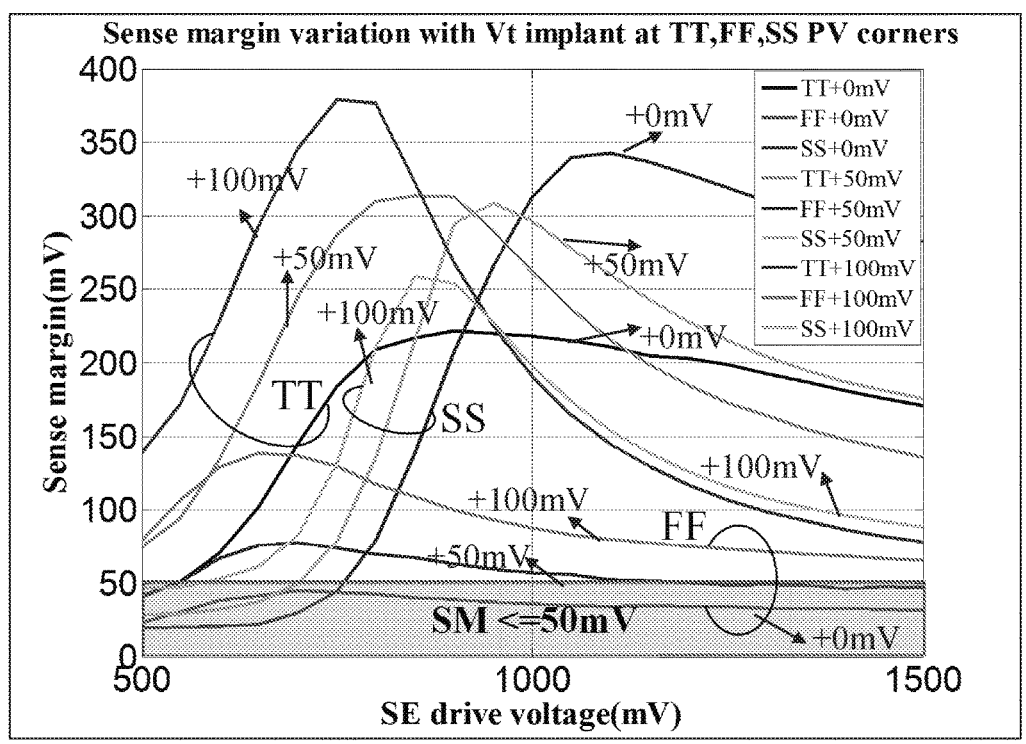
FIG. 11A is a graphical illustration of the results at 1V for the three PV corners for 256-bit word at different SE signal voltages, and 0 mV, 50 mV and 100 mV higher Vth, in accordance with an embodiment of the present invention.
Figure 11B:
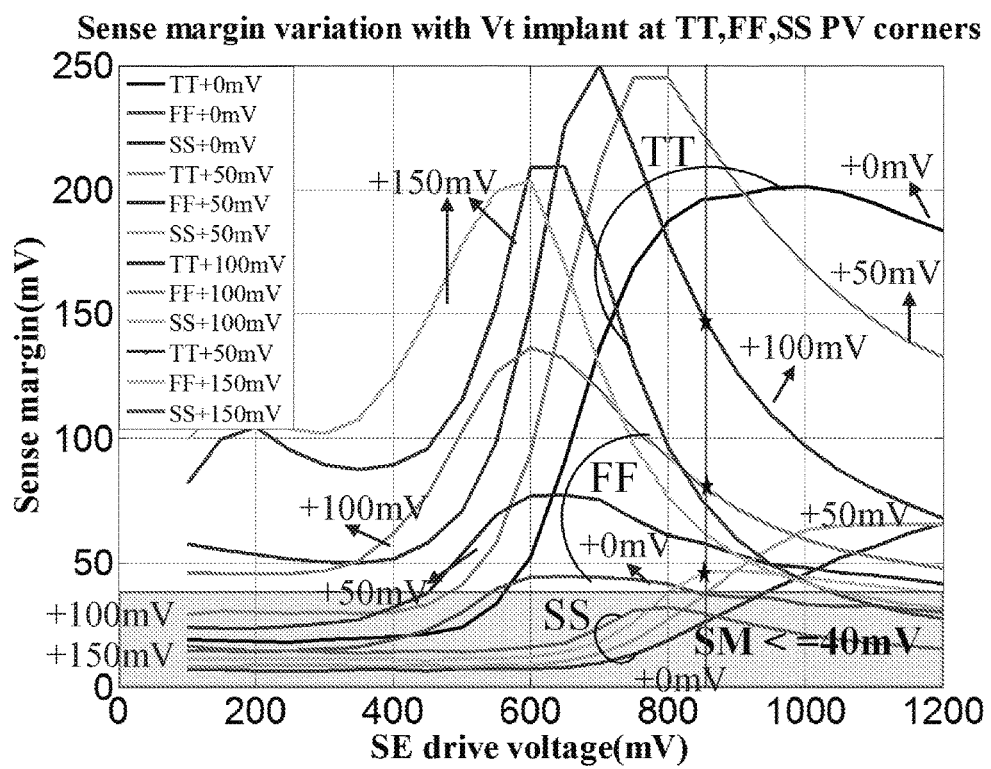
FIG. 11B is a graphical illustration of the sense margin across three PV corners with Vth implants at 850 mV supply voltage in accordance with an embodiment of the present invention.

In order to solve the poor sense margin, $V_{th0}$, Δ1 and Δ2 were modulated by exploring threshold voltage modulation of transistor M1 230 and M2 235 (to tune $V_{th0}$) and SE 250 voltage modulation (to tune Δ1 and Δ2). FIG. 11A illustrated the results at 1V for the three PV corners for 256-bit word at different SE signal voltages, and 0 mV, 50 mV and 100 mV higher $V_{th}$. Change in the gate drive of M3 265 and M4 270 changes their ON resistance and results in corresponding change in Δ1 and Δ2. It can be noted that an optimum choice of SE can improve the sense margin. Moreover, repositioning of $V_{th0}$ can improve the sense margin even further. FIG. 11B illustrates the sense margin across three PV corners with $V_{th}$ implants at 850 mV supply voltage. It can be noted that $V_{th}$ modulation can improve the worst case sense margin significantly (FF and SS in this case) even though the sense margin in TT corner is degraded. The improvement results from decreased match case current through M1 230 and M2 235 at SS and the reverse effect in miss case at FF. At the same time lower SE increases the resistance of M3/M4 which in turn increases Δ2. As expected, the sense margin in FF with $V_{th}$ implant is comparable to TT corner without implant. With 100 mV $V_{th}$ implant the design can provide a reliable sense margin of above 40 mV in all the PV corners, even without SE modulation. A 150 mV SE under-drive can improve the sense margin at TT to more than 120 mV and a 250 mV SE under-drive can improve the sense margin at FF to more than 50 mV.

TCAM cell currently known in the art consist of 16 transistors while the TCAM cell in accordance with the present invention, includes only 6 NMOS transistors and 2 MTJ devices, which results in a device that is 127% more area-efficient.

For power comparison, the CMOS TCAM in the prior art was implemented and simulated using 22 nm predictive model. The leakage power of the TCAM cell of the present invention is zero while SRAM TCAM consumes a considerable amount of standby power. In the mostly OFF applications, such as "Internet of Things" and smartphone, the TCAM cell of the present invention could be quite beneficial compared to CMOS CAM. While the search power consumption of the TCAM cell of the present invention is higher compared to CMOS TCAM currently known in the art, due to the search line current (—51 uA in case of a mismatch at IV) drawn to generate a secondary voltage at the drain terminals of M3 265 and M4 270, which enables the discharge transistors of ML 215. The search line current can be reduced further by selecting MTJ devices with high $R_L$ and high TMR. The power consumption during search operation of '1' and '0' bits at 0.8V in MTJ device based TCAM is observed to be up to 80% higher in the worst case (successful search of '1') compared to NOR type CMOS TCAM currently known in the art. Table 2 summarizes the power consumption during search operation of '1', '0' and 'X' bits at 1V and 0.8V.

TABLE 2

Power (in μW) comparison of CMOS and current TCAM.

| | Match 1/0 | Miss 1/0 | Search 'X' from SL, /SL = 0 | Search 'X' with D=/D = 1 |
|---|---|---|---|---|
| CMOS $V_{dd}$ = 0.8 V | 0.3 | 2.03 | 1.03 | 0.2403 |
| Current $V_{dd}$ = 0.8 V | 24.84 | 23.8 | 0.6 | 22.39 |
| Current $V_{dd}$ = 1 V | 43.07 | 53.3 | 1.02 | 41.25 |

A spintronic TCAM was disclosed herein and can be seen to be promising for zero standby leakage and area-efficiency, thus improving the functioning of the CAM and overall computing system. Detailed analysis was conducted in the presence of process, voltage, and temperature variations for a wide range of word sizes. As such, it is shown that, the TCAM cell design can operate with reliable sense margin up to 128-bit word size till 0.7V. Threshold voltage modulation and search enable underdrive were also discussed herein to improve sense margin for 256-bit word. The TCAM cell of the present invention is 127% area-efficient compared to conventional CMOS TCAM and 33-50% area efficient compared to other spintronic CAMs.

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

The advantages set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of

What is claimed is:

1. A Magnetic Tunnel Junction (MJT) Ternary Content Addressable Memory (TCAM) cell, comprising:
   a first Magnetic Tunnel Junction (MTJ) device having a first node coupled to a search line;
   a second MTJ device having a first node coupled between to a complement search line;
   a first match line discharge transistor having a gate coupled to a second node of the first MTJ device;
   a second match line discharge transistor having a gate coupled to a second node of the second MTJ device;
   a first word line selection transistor having a drain coupled to the gate of the first matchline discharge transistor and the second node of the first MTJ device;
   a second word line selection transistor having a drain coupled to the gate of the second matchline discharge transistor and to the second node of the second MTJ device;
   a write access transistor having a drain coupled to a source of the first word line selection transistor and to the source of the second word line selection transistor; and
   a search enable transistor having a drain coupled to a source of the first word line selection transistor and to the source of the second word line selection transistor.

2. The TCAM cell of claim 1, wherein the first MTJ device comprises:
   a first magnetic layer having a pined magnetization direction;
   a second magnetic layer having a free magnetization direction; and
   a magnetic oxide disposed between the first magnetic layer and the second magnetic layer.

3. The TCAM cell of claim 1, wherein the second MTJ device comprises:
   a first magnetic layer having a pined magnetization direction;
   a second magnetic layer having a free magnetization direction; and
   a magnetic oxide disposed between the first magnetic layer and the second magnetic layer.

4. The TCAM cell of claim 1, wherein a logic state of a bit stored in the TCAM cell is represented by the relative resistance of the first MJT device and the second MJT device.

5. The TCAM cell of claim 1, wherein the first match line discharge transistor further comprises a drain coupled to a match line and a source coupled to a source line and wherein the second match line discharge transistor further comprises a drain coupled to the match line and a source coupled to the source line.

6. The TCAM cell of claim 1, wherein the first word line selection transistor further comprises a gate coupled to a first word line and wherein the second word line selection transistor further comprises a gate coupled to a second word line.

7. The TCAM cell of claim 1, wherein the write access transistor further comprises a gate coupled to a write signal and a source coupled to a source line.

8. The TCAM cell of claim 1, wherein the search enable transistor further comprises a gate coupled to a search enable signal and a source coupled to a source line.

9. The TCAM cell of claim 1, wherein the threshold voltage of the first match line discharge transistor and the threshold voltage of the second match line discharge transistor are greater than a voltage at the second node of the first MJT device and a voltage at the second node of the second MJT device during a match condition.

10. The TCAM cell of claim 1, wherein the threshold voltage of the first match line discharge transistor or the threshold voltage of the second match line discharge transistor is less than a voltage at the second node of the first MJT device and a voltage at the second node of the second MJT device during a mismatch condition.

11. The TCAM cell of claim 1, wherein the write access transistor is sized to provide a drain current that is greater than a critical write current of the first MJT device and the second MJT device during a write operation.

12. The TCAM cell of claim 1, wherein a low resistance value of the first MJT device and the second MJT device and a size of the search enable transistor are selected to provide a search current that is below a critical current of the first MJT device and the second MJT device.

13. The TCAM cell of claim 1, wherein a high resistance value of the first MJT device and the second MJT device is determined by the Tunnel Magneto Resistance (TMR) of the TCAM cell.

14. A Ternary Content Addressable Memory (TCAM) device, comprising a plurality of TCAM cell, wherein each of the plurality of TCAM cells comprises:
   a first Magnetic Tunnel Junction (MTJ) device having a first node coupled to a search line;
   a second MTJ device having a first node coupled between to complement search line;
   a first matchline discharge transistor having a gate coupled to a second node of the first MTJ device;
   a second matchline discharge transistor having a gate coupled to a second node of the second MTJ device;
   a first wordline selection transistor having a drain coupled to the gate of the first matchline discharge transistor and the second node of the first MTJ device;
   a second wordline selection transistor having a drain coupled to the gate of the second matchline discharge transistor and to the second node of the second MTJ device;
   a write access transistor having a drain coupled to a source of the first wordline selection transistor and to the source of the second wordline selection transistor; and
   a search enable transistor having a drain coupled to a source of the first wordline selection transistor and to the source of the second wordline selection transistor.

15. A method for operating a Magnetic Tunnel Junction (MJT) Ternary Content Addressable Memory (TCAM) cell, the method comprising:
   precharging a match line of the TCAM cell to positive voltage supply level, wherein the match line is coupled to a drain of a first match line discharge transistor and to a drain of a second match line transistor, and wherein a gate of the first match line discharge transistor is coupled to a second node of a first MJT device and a gate of the second match line discharge transistor is coupled to a second node of a second MJT device;
   providing a ground voltage supply level to a gate of a write access transistor and to a source line coupled to a source of the write access transistor;
   providing a positive voltage supply level to a gate of search enable transistor and to a gate of a first word line selection transistor and a gate of a second word line selection transistor, wherein a source of the search enable transistor is coupled to the source line and a drain of the search enable transistor is coupled to a source of the first match line discharge transistor and to a source of the second match line discharge transistor;

providing search data on a search line and on a complement search line to be compared against data stored in the first MJT device and in the second MJT device, where a first node of the first MJT device is coupled to the search line and a first node of the second MJT device is coupled to the complement search line; and turning the first match line discharge transistor and the second match line discharge transistor OFF to maintain a charge on the precharged match line if the search data matches the data stored in the first MJT device and in the second MJT device, or turning the first match line discharge transistor and the second match line discharge transistor ON to discharge the precharged match line.

16. The method of claim 15, further comprising writing the data stored in the first MJT device and in the second MJT device, prior to precharging the match line.

17. The method of claim 16, wherein writing the data stored in the first MJT device and in the second MJT device further comprises:

providing a ground voltage supply level to the gate of the search enable transistor to disable the search enable transistor;

providing a positive voltage supply level to the gate of the write access transistor, wherein a drain of the write access transistor is coupled to a source of the first wordline selection transistor and to a source of the second wordline selection transistor;

providing a positive voltage supply level to a first word line coupled to the gate of the first wordline selection transistor or to a second word line coupled to the gate of the second wordline selection transistor for a selected word and controlling the search line to write stored data in the first MJT device and in the second MJT device provided by the search line and the complement search line.

18. The method of claim 17, wherein providing a positive voltage supply level to a first word line coupled to the gate of the first wordline selection transistor or to a second word line coupled to the gate of the second wordline selection transistor for a selected word and controlling the search line to write stored data in the first MJT device and in the second MJT device provided by the search line and the complement search line further comprises, writing a logic "1", which further comprises:

providing a positive voltage supply level to the gate of the first wordline selection transistor and providing a ground voltage supply level to the gate of the second wordline selection transistor, providing a positive voltage supply level to the source line and providing a ground voltage supply level to the search line to provide a write current to write an antiparallel state to the first MTJ device in the first cycle; and providing a ground voltage supply level to the gate of the first wordline selection transistor, providing a positive voltage supply level to the gate of the second wordline selection transistor and providing a write current to write a parallel state to the second MTJ device, in a second cycle.

19. The method of claim 17, providing a positive voltage supply level to a first word line coupled to the gate of the first wordline selection transistor or to a second word line coupled to the gate of the second wordline selection transistor for a selected word and controlling the search line to write stored data in the first MJT device and in the second MJT device provided by the search line and the complement search line further comprises, writing a logic "0", which further comprises:

providing a positive voltage supply level to the gate of the first wordline selection transistor and providing a ground voltage supply level to the gate of the second wordline selection transistor, providing a positive voltage supply level to the source line and to the complement search line and providing a ground voltage supply level to the search line to provide a write current from the search line to write a parallel state to the first MTJ device in a first cycle; and providing a ground voltage supply level to the gate of the first wordline selection transistor, providing a positive voltage supply level to the gate of the second wordline selection transistor, providing a ground voltage supply level to the source line to providing a write current to write an antiparallel state to the second MTJ device, in a second cycle.

20. The method of claim 17, providing a positive voltage supply level to a first word line coupled to the gate of the first wordline selection transistor or to a second word line coupled to the gate of the second wordline selection transistor for a selected word and controlling the search line to write stored data in the first MJT device and in the second MJT device provided by the search line and the complement search line further comprises, writing a logic "X", which further comprises:

providing a positive voltage supply level to the gate of the first wordline selection transistor and to the gate of the second wordline selection transistor; and providing a positive voltage supply level to the source line, providing a ground voltage supply level to the search line and to the complement search line to provide a write current from the search line to write an antiparallel state to the first MTJ device and to write an antiparallel state to the second MTJ device, in the same cycle.

* * * * *